United States Patent [19]
Kobatake

[11] Patent Number: 5,680,132
[45] Date of Patent: Oct. 21, 1997

[54] DIGITAL TO ANALOG CONVERTER HAVING A STRING OF RESISTORS

[75] Inventor: Hiroyuki Kobatake, Tokyo, Japan

[73] Assignee: NEC Corporation, Tokyo, Japan

[21] Appl. No.: 573,039

[22] Filed: Dec. 15, 1995

[30] Foreign Application Priority Data

Dec. 15, 1994 [JP] Japan .................. 6-332857
[51] Int. Cl.⁶ .................................................. H03M 1/78
[52] U.S. Cl. ........................................ 341/154; 341/144
[58] Field of Search ............................... 341/144, 145, 341/133, 146–148, 154

[56] References Cited

U.S. PATENT DOCUMENTS

| | | |
|---|---|---|
| 5,059,978 | 10/1991 | Valdenaire ........................ 341/145 |
| 5,093,661 | 3/1992 | Tanimoto .......................... 341/144 |
| 5,343,199 | 8/1994 | Sugawa ............................ 341/159 |
| 5,528,520 | 6/1996 | Kemp ............................. 364/571.04 |

FOREIGN PATENT DOCUMENTS

| | | |
|---|---|---|
| 60-112327 | 6/1985 | Japan . |
| 63-202957 | 8/1988 | Japan . |

*Primary Examiner*—Jeffrey A. Gaffin
*Assistant Examiner*—Peguy JeanPierre
*Attorney, Agent, or Firm*—Young & Thompson

[57] ABSTRACT

A semiconductor device has a substrate having a first portion and a second portion, the first portion being separate from the second portion, several resistors formed in the first portion connected to each other via several nodes in series and formed as a serpentine, and a selection circuit connected between each of the nodes and an output terminal formed in the second portion for selecting one of the nodes and outputting a voltage of the selected node to the output terminal.

12 Claims, 14 Drawing Sheets

DIGITAL TO ANALOG CONVERTER HAVING A STRING OF RESISTORS

BACKGROUND OF THE INVENTION

1. Field of the Invention

The present invention relates to a digital/analog converter (hereinafter, referred to as a DA converter), more particularly to a DA converter having a plurality of resistors connected in series to each other.

2. Description of the Related Art

DA converters are used for converting a digital signal into an analog signal. The structure of a conventional DA converter is disclosed in, for example, Japanese Patent Laid-Open shou 60-112327, wherein diffusion resistors are disposed in a serpentine fashion and an output is fetched from both sides of a resistor string. By employing such a constitution, the DA converter is able to cope with the requirement for a precise operation only by increasing slightly an occupied area even when a long resistor string is required as a unit resistor string (hereinafter, referred to as an R string).

As shown in FIG. 9, the DA converter comprises a serpentine resistor 21 (hereinafter, referred to as a serpentine R string) having such a constitution that a plurality of resistor elements R00 to R15 are connected in series between positive and negative reference voltage terminals Vref and −Vref, and meander to form a symmetrical shape. Each of the resistor elements R00 to R15 is composed of a main resistor component extending the length of a diffusion layer of a predetermined width by a predetermined interval, and a sub resistor component extending perpendicularly into the main resistor component which is connected to the main resistor component.

In order to selectively output the potentials outputted from each of the connection nodes of the resistor elements R00 to R15, selection circuits 22' and 22" composed of first and second switching element groups S00 to S03, S04 to S07, S08 to S11, and S12 to S15, and S0 to S3 are arranged at both sides of the serpentine R string 21, respectively. First selection signals A00 to A03 are applied to the gates of the first switching element group S00 to S03, S04 to S07, S08 to S11, and S12 to S15, and second selection signals A0 to A3 are applied to the gates of the second switching element group S0 to S3. The first and second switching element groups are composed of, for example, N channel MOS transistors.

Each of the connection nodes of the resistor elements R00 to R15 is connected to each of one terminals of the first switching element group S00 to S15 with metal wirings, respectively. The other terminals of the first switching element group S00 to S15 are connected to the corresponding terminals of the second switching element group S0 to S3 with metal wirings, respectively. The other terminals of the switching elements S00, S04, S08, and S12 are connected in common to one terminal of the switching element S0. Other switching elements of the first switching element group are connected to the corresponding switching element of the second switching group in the same manner as above. The other terminals of the switching elements S0 to S3 of the second switching element group are connected to each other with the metal wiring to produce the output OUT. The equivalent circuit of FIG. 9 is shown in FIG. 10.

In the conventional DA converter, any potential outputted from each of the connection nodes of the resistor elements R00 to R15 is outputted from the output terminal OUT through the switching elements selected by the first and second selection signals A00 to A03 and A0 to A3. The output voltage Vout is given by the formula (1).

$$V_{OUT} = \frac{\sum_{n=0}^{i} R_n}{\sum_{n=0}^{15} R_n} \{(+V_{ref}) - (-V_{ref})\} \tag{1}$$

The conventional DA converter is constituted as a 4-bits DA converter. In this DA converter, the potential difference between the +Vref reference voltage and the −Vref voltage is divided by 1/16, and the voltage value obtained by dividing this potential difference by 1/16 is used as one step. Two-bits of the four bit digital input are decoded, thereby outputting them as the first selection signal A00 to A03, and the residual two bits are decoded, thereby outputting them as the second selection signal A0 to A3. The selected switching elements are controlled to assume the ON state by the selection signals A00 to A03 by selection signals.

FIGS. 13A and 13B illustrate schematically the output characteristics expressed by the formula (1). Referring to FIGS. 13A and 13B, the following facts will be found from the broken line. The analog output ranges from the minimum and maximum values, namely, from the reference voltage −Vref to the reference voltage +Vref corresponding to the minimum and maximum values of the digital inputs. The offset value is made zero, hence the straight line error will not be present at all, and the broken line indicates the ideal input/output characteristic of the DA converter. In the foregoing conventional DA converter, although the resistor elements R00 to R15 are arranged as a serpentine, the resistor elements R00 to R15 are aligned in series. Therefore, for example, the distance between the resistors R00 and R15 is large. Moreover, in high precision DA converters, the distance is, remarkably apt to be larger since many resistor elements are connected in series to each other.

Referring to FIG. 14A, the resistor elements R00 to R03 and other resistor elements are composed of the high concentration N type diffusion layers (N+type) 104 which are formed in the surface of the semiconductor substrate (P type substrate) 103, and are connected in series to each other through the contact holes 102. Therefore, in the case where the region that generates noises, e.g., the digital circuit 101, is present, the resistor elements R00 to R03 and other resistor elements and the digital circuit 102 are connected electrically to each other through the inherent resistance of the semiconductor substrate, and through the capacitance of the diffusion layers.

In FIG. 14B, the inherent substrate resistance and the diffusion layer capacitances are expressed as the resistors r00 to r03 and other resistors and the capacitances C00 to C03 and other capacitances, respectively. It should be noted that the resistor r00 expresses the substrate resistance between the digital circuit 101 and the resistor element R00, and the resistors r01 to r03 and other resistors express the substrate resistance between the resistor elements such as the resistor elements R00 to R03 and other resistor elements. The resistor element, e.g., R00, arranged in the neighborhood of the digital circuit 101 is coupled electrically to the digital circuit 101 through the substrate resistor r00 of comparatively low resistivity and the diffusion layer capacitance C00. The resistor element arranged at a long distance from the digital circuit 101, e.g., the resistor element R15 arranged at the position most distant from the resistor element R00 in FIG. 9, is coupled electrically to the digital circuit 101 through the substrate resistor of relatively high resistivity and the diffusion layer capacitance C15, the substrate resistance being the sum of the substrate resistors Sr=r00+r01+r02+r03+...+r15.

Therefore, the resistor element in the neighborhood of the digital circuit 101 is greatly affected by noise. However, the resistor elements arranged at a long distance from the digital circuit 101 are scarcely affected by this noise.

For this reason, referring to FIG. 9, in the case where the noise source is present in the neighborhood of, e.g., the resistor element R00 and the noise is generated in the positive direction, the output close to the negative reference voltage −Vref greatly shifts toward the positive direction, namely, an offset voltage is generated, as shown with the solid line in the input/output characteristic of the DA converter in FIG. 13A. On the other hand, the output voltage in the neighborhood of the positive reference voltage +Vref almost never shift.

In this case, it is possible to reduce slightly the straight line error by an offset adjustment and a gain adjustment, as shown with the solid line of FIG. 13B. However, it is impossible to remove fully the straight line error.

Specifically, in the conventional DA converter shown in FIG. 9, the distance between the resistor elements, e.g. the resistor elements R00 and R15, is large so that the resistor elements greatly affected by the noises and ones slightly affected coexist. From this reason, the problem of the straight line error occurs.

In view of these circumstances, to reduce the distance between the resistor elements, the DA converter shown in FIG. 11 has been proposed.

Referring to FIG. 11, the conventional DA converter comprises first, second, and third R strings 31', 31", and 31'" formed between the positive +Vref and the negative −Vref reference voltages, which are constituted by the serpentine series circuits composed of the resistor elements R00 to R03, R04 to R07, R08 to R11, and R12 to R15 connected to each other in series.

To selectively fetch the potentials outputted from each of the connection nodes of the resistor elements R00 to R15, first and second selecting circuits 32' and 32" are arranged between the first R string 31' and the second R string 31", and the second R string 31" and the third R string 31'", respectively. The first and second selection circuits 32' and 32" are composed of the first switching element group S00 to S03, S04 to S07, S08 to S11, and S12 to S15, which are N channel MOS transistors the gates of which are supplied with first selection signals A01 to A03.

A third selection circuit 32'" composed of a second switching element group S0 to S3 is arranged at one side of the third R string 31'". The second switching element group S0 to S3 is composed of N channel MOS transistors the gates of which are supplied with the second selection signals A0 to A3. Each of the connection nodes of the resistor elements R00 to R15 is connected to each of the one terminals of the first switching element group S00 to S15 with a metal wiring. The other terminals of the switching elements S00, S07, S08, and S15; S01, S06, S09, and S14; S02, S05, S10, and S13; S03, S04, S11, and S21 are connected to the one terminal of the switching elements S0 to S3 with a metal wiring. The other terminal of the switching elements S0 to S3 are connected to an output terminal OUT with a metal wiring to fetch an output. An equivalent of this conventional DA converter is shown in FIG. 12.

It should be noted that the operation of the DA converter of FIG. 11 is similar to that of the conventional DA converter described above with reference to FIGS. 9 and 10. The description concerning the operation of the DA converter of FIG. 11 will be omitted.

However, also in the conventional DA converter shown in FIG. 11, since the first and second selection circuits 32' and 32" composed of the switching elements S00 to S15 are disposed between the first and second series circuits 31' and 31", and the second and third series circuits 31" and 31'" composing the R string for making the lengthen of connecting wirings between the switching elements S00 to S15 and each of the series circuit 31', 31", 31'". As a results, the distance between the resistor elements, for example, R00 and R15, is large. Moreover, the number of the resistor elements tends to increase, the distance between the resistor elements tends to increase. Therefore, as described above, there has been the problem that the resistor elements affected greatly by the substrate noise and ones slightly affected coexist so that the straight line error will be caused.

According to Japanese Patent Laid-Open sho 63-202957, as shown in FIG. 15, means for achieving the high-precision resistor ratio is proposed, in which one group of resistor element units are coupled in series to each other and the other group of resistor element units are coupled in parallel to each other. However, means for outputting freely any voltage obtained by the bleeder resistors is not disclosed at all. Moreover, this prior art does not address the technical viewpoint concerning the occurrence of the straight line error caused in the DA converter, due to the noise transmitting through the substrate, and the removal of the straight line error. This is because, the prior art teaches one resistor having a fixed exact resistor value.

SUMMARY OF THE INVENTION

An object of the present invention is, therefore, to provide a DA converter which is able to greatly reduce a straight line error even when noise are occurs on a substrate where resistor elements are formed.

To achieve the above object, the DA converter of the present invention comprises an R string formed by a plurality of series circuits arranged as a serpentine, in which a plurality of resistor elements are in alignment with the resistor elements formed on an insulating film formed in the neighborhood of a surface of a semiconductor substrate or on the surface of the semiconductor substrate; and a selection circuit composed of switching elements for outputting selected potentials from connection nodes of the resistor elements, which is disposed in at least one side of the R string.

From the point of view mentioned above, the DA converter according to the present invention comprises a substrate having a first portion and a second portion, the second portion formed separate from the first portion, a first string connected between a first terminal supplying a first voltage and a first node, the first string having a plurality of resistors connected between the first terminal and the first node in series and formed in a first direction, and the resistors connected to each other via a plurality of nodes, a second string connected between a second node and a third node, the second string having a plurality of resistors connected between the second node and the third node in series and formed in the first direction, the resistors connected to each other via a plurality of nodes, and the second string formed in parallel the first string, a third string connected between a fourth node and a fifth node, the third string having a plurality of resistors connected between the fourth node and the fifth node in series and formed in the first direction, the resistors connected to each other via a plurality of nodes, and the third string formed in parallel the first string and the second string, a fourth string connected between a sixth node and a second terminal supplying a second voltage, the fourth string having a plurality of resistors connected between the sixth node and the second node in series and formed in the first direction, the resistors connected to each other via a plurality of nodes, the fourth string formed in parallel the first string, the second string and the third string, first connecting means for connecting the first node to the second node, the third node to the fourth node and the fifth node to the sixth node, respectively, and the strings connected to each other as serpentine, and selective means connected between each of the nodes and an output terminal formed in the second portion for selecting one of the nodes and outputting a voltage of the selected node to the output terminal.

Thus, all resistors are formed on a limited area, the effect of noise upon the nearest resistor and the furthest resistor is almost same value. Therefore, the characteristics of the straight line error is almost on a straight line.

BRIEF DESCRIPTION OF THE DRAWINGS

The above and other objects, advantages and features of the present invention will be more apparent from the following description taken in conjunction with the accompanying drawings, in which

FIG. 5A shows an ideal input/output characteristic of the DA converter of the present invention and an input/output characteristic when noises are occurred, and FIG. 5B shows an input/output characteristic after offset and gain adjustments;

FIG. 13A shows an ideal input/output characteristic of the conventional DA converter and an input/output characteristic when noises are occurred, and FIG. 13B shows an input/output characteristic after offset and gain adjustments;

DETAILED DESCRIPTION OF THE PREFERRED EMBODIMENTS

The present invention will be described with reference to the accompanying drawings hereinafter.

Figure 1:
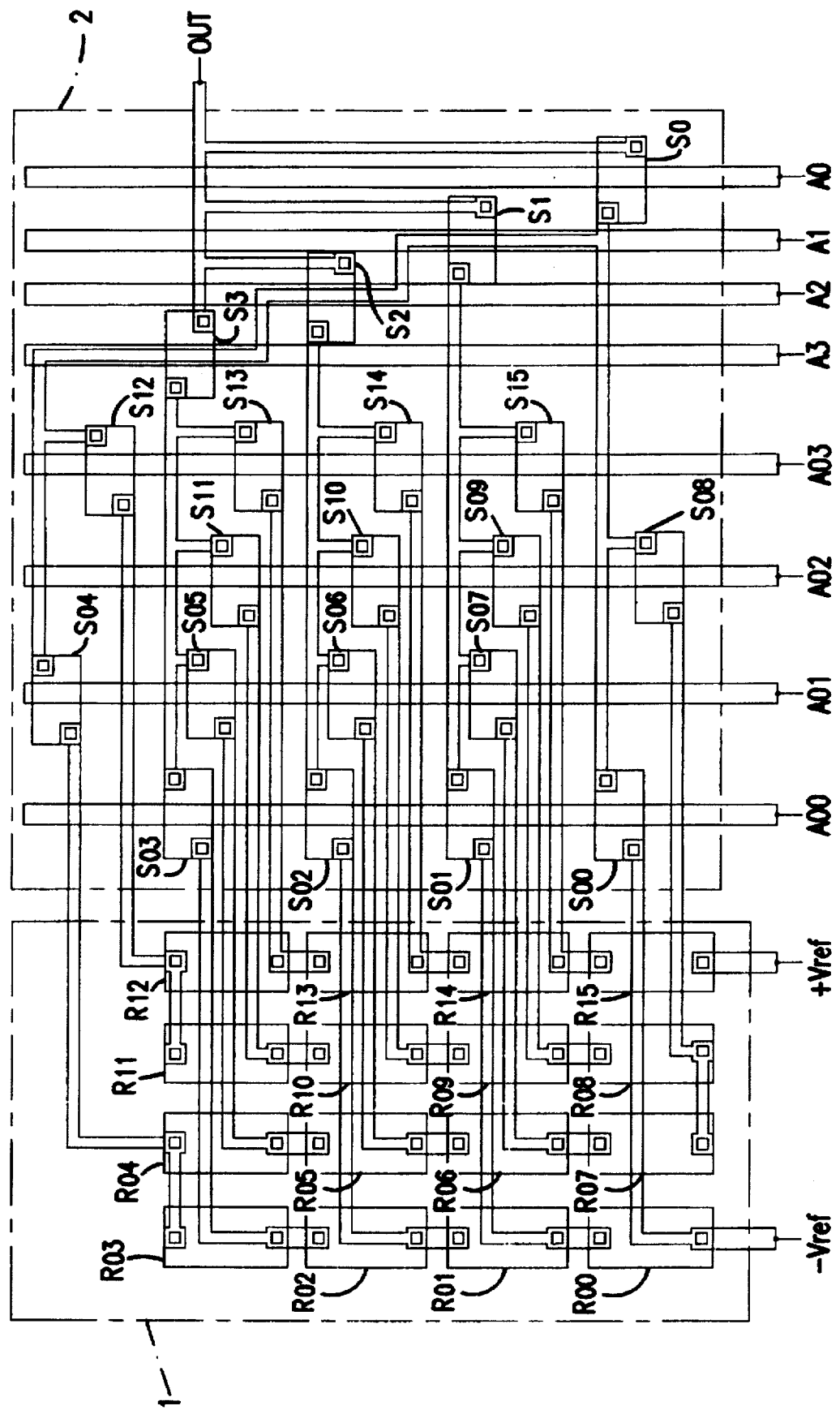
FIG. 1 is a diagram showing a layout of an embodiment of the DA converter of the present invention.

Referring to FIG. 1, the DA converter of first embodiment comprises an R string 1 disposed between positive and negative reference voltages (Vref and −Vref), in which series circuits are formed by arranging a plurality of resistor elements in alignment as a serpentine. The R string 1 comprises a first series circuit composed of four resistor elements R00 to R03 arranged in alignment, a second series circuit composed of four resistor elements R04 to R07 arranged in alignment, a third series circuit composed of four resistor elements R08 to R11 arranged in alignment, and a fourth series circuit composed of four resistor elements R12 to R15 arranged in alignment. The series circuits adjacent to each other are electrically coupled by connecting respective terminals with metal wirings so that the series circuits appear as a serpentine.

To fetch selective potentials outputted from the connection nodes of the resistor elements R00 to R15, a selection circuit 2 is disposed at one side of the R string 1. The R string 1 comprises a first switching element group S00 to S03, S04 to S07, S08 to S11, and S12 to S15 composed of N channel MOS transistors, the gates of which are supplied with first selection signals A01 to A03, and a second switching element group S0 to S3 composed of N channel MOS transistors, the gates of which are supplied with second selection signals A0 to A3.

The connection nodes of the resistor elements R00 to R15 are connected to a corresponding terminal of a plurality of switching elements S00 to S15 of the first switching element group with metal wirings. The other terminals of the plurality of the switching elements S00 to S15 of the first switching element group are connected to a corresponding terminal of switching elements S0 to S3 of the second switching element group. The other terminals of the plurality of the switching elements S00, S04, S08, and S12 of the first switching element group are connected in common to one terminal of the switching element S0. Similarly to this, the other terminals of the switching elements S01, S07, S09, and S15 are connected to one terminal of the switching element S1, the other terminals of the switching elements S02, S06, S10, and S14 are connected to one terminal of the switching element S2, and the other terminals of the switching elements S03, S05, S11, and S13 are connected to one terminal of the switching element S3.

The other terminals of the switching elements S0 to S4 of the second switching element group are connected in common to each other with metal wirings. An output OUT is fetched from these connection nodes.

Figure 2:
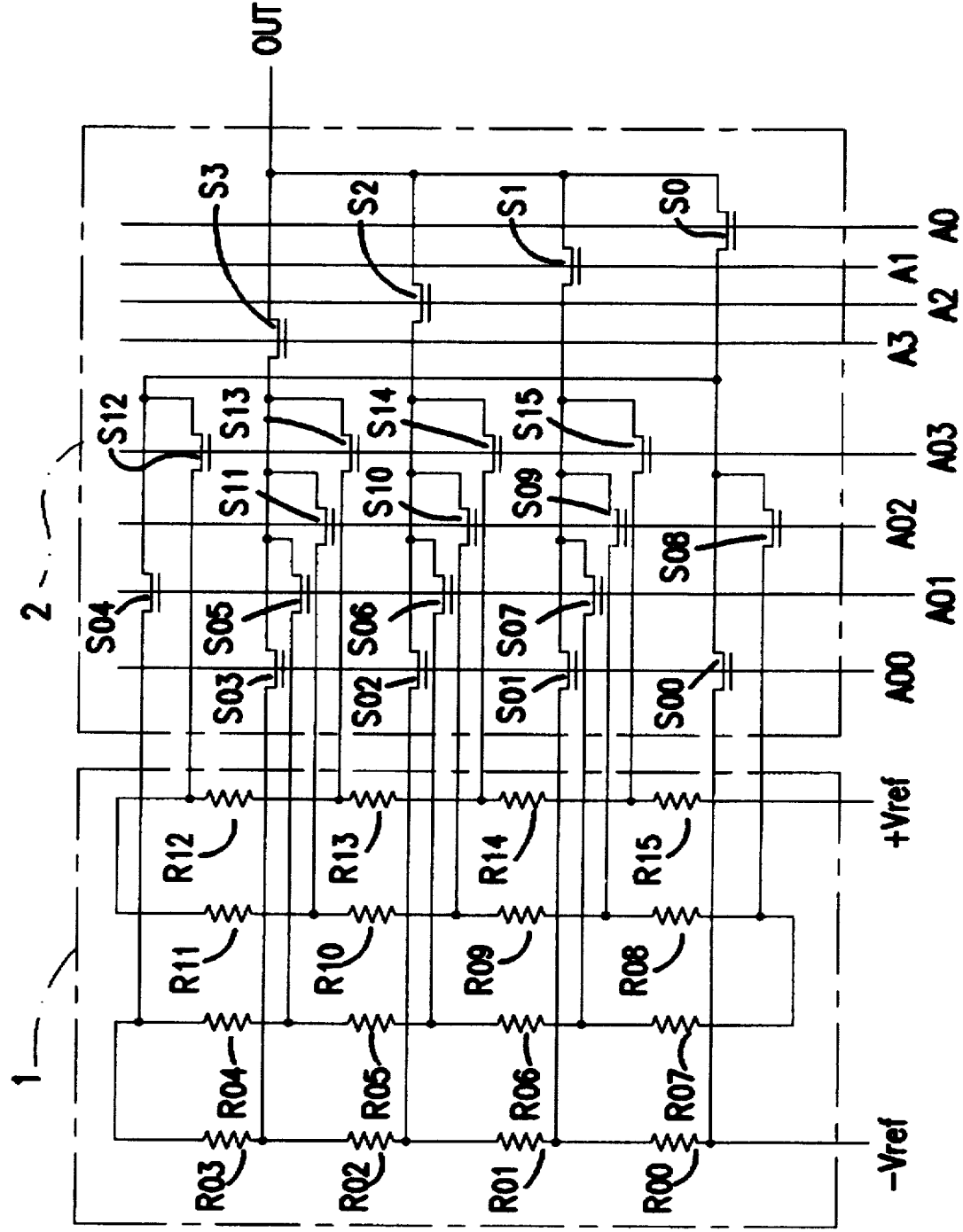
FIG. 2 is a diagram showing an equivalent circuit of the embodiment of the DA converter of the present invention.

An equivalent circuit of the DA converter of the first embodiment of FIG. 1 is shown in FIG. 2. The DA converter of this embodiment is constituted as a DA converter of four bits type. The potential difference between the positive and negative reference voltages −Vref and +Vref is divided into 16 divisions and one division is treated as one step. Two bits of the four bit digital input are decoded to be outputted as the first selection signals A00 to A03, and the residual two bits digital inputs are decoded to be outputted as the second selection signals A0 to A3. Hence, the selected switching elements are controlled to assume the ON state by selection signals A00 to A03 and by selection signals A0 to A3.

Figure 5A:
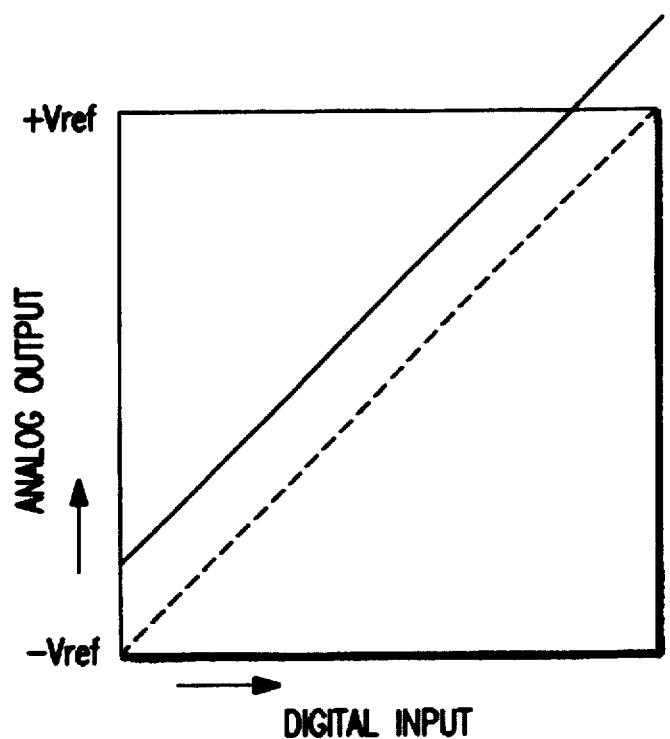
FIGS. 5A and 5B are diagrams showing schematically an input/output characteristic of the DA converter of the present invention, particularly.

The potentials outputted from each of the connection nodes of the resistor elements R00 to R15 are outputted from the output terminal OUT through the switching elements selected by the selection signals A00 to A03, and A0 to A3. The output voltage Vout is given by the foregoing formula (1). In FIG. 5A, the input/output characteristic given from the formula (1) is shown schematically by the broken line.

According to the first embodiment shown in FIG. 1, any value of the output voltage Vout expressed by the formula (1) can be outputted, and the R string 1 can be constituted by the serpentine-shaped series circuits composed of the plurality of the resistor elements R00 to R03, R04 to R07, R08 to R11, and R12 to R15 which are arranged in alignment. The distances between the resistor elements can be reduced to the minimum, and the mutual distances of the resistor elements become very small so that the distances between the region where noise occur e.g., the digital circuit and each of the resistor elements can be made approximately equal.

Figure 14A:
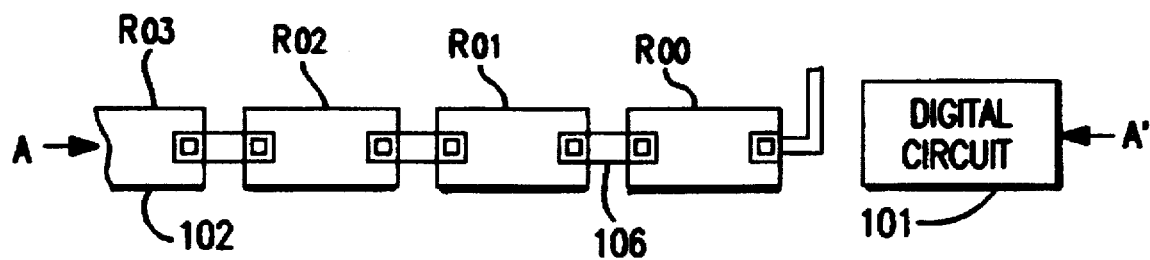
FIG. 14A is a diagram showing an arrangement of the resistor elements and a digital circuit formed on the semiconductor substrate.
Figure 14B:
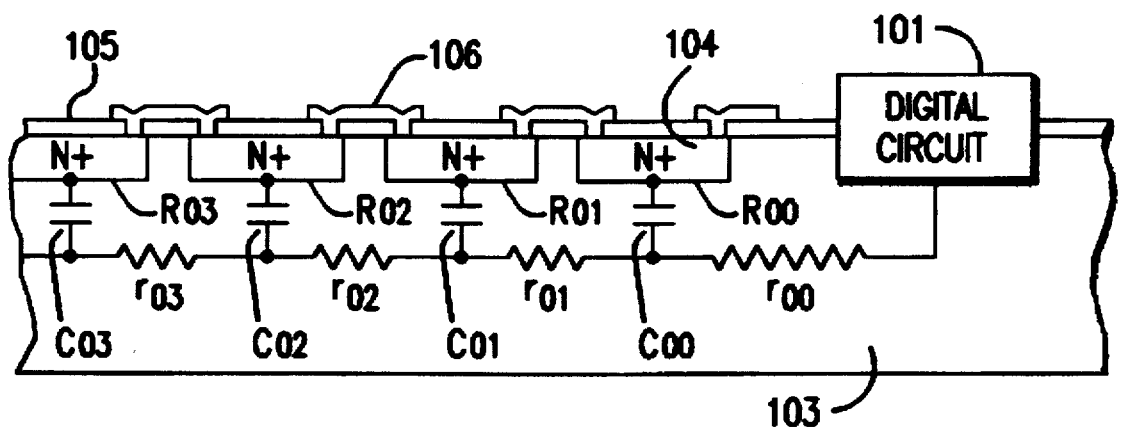
FIG. 14B is a sectional view taken along the line A—A' of FIG. 14A, for explaining electrical couplings of the resistor elements and the digital circuit.
Figure 15:
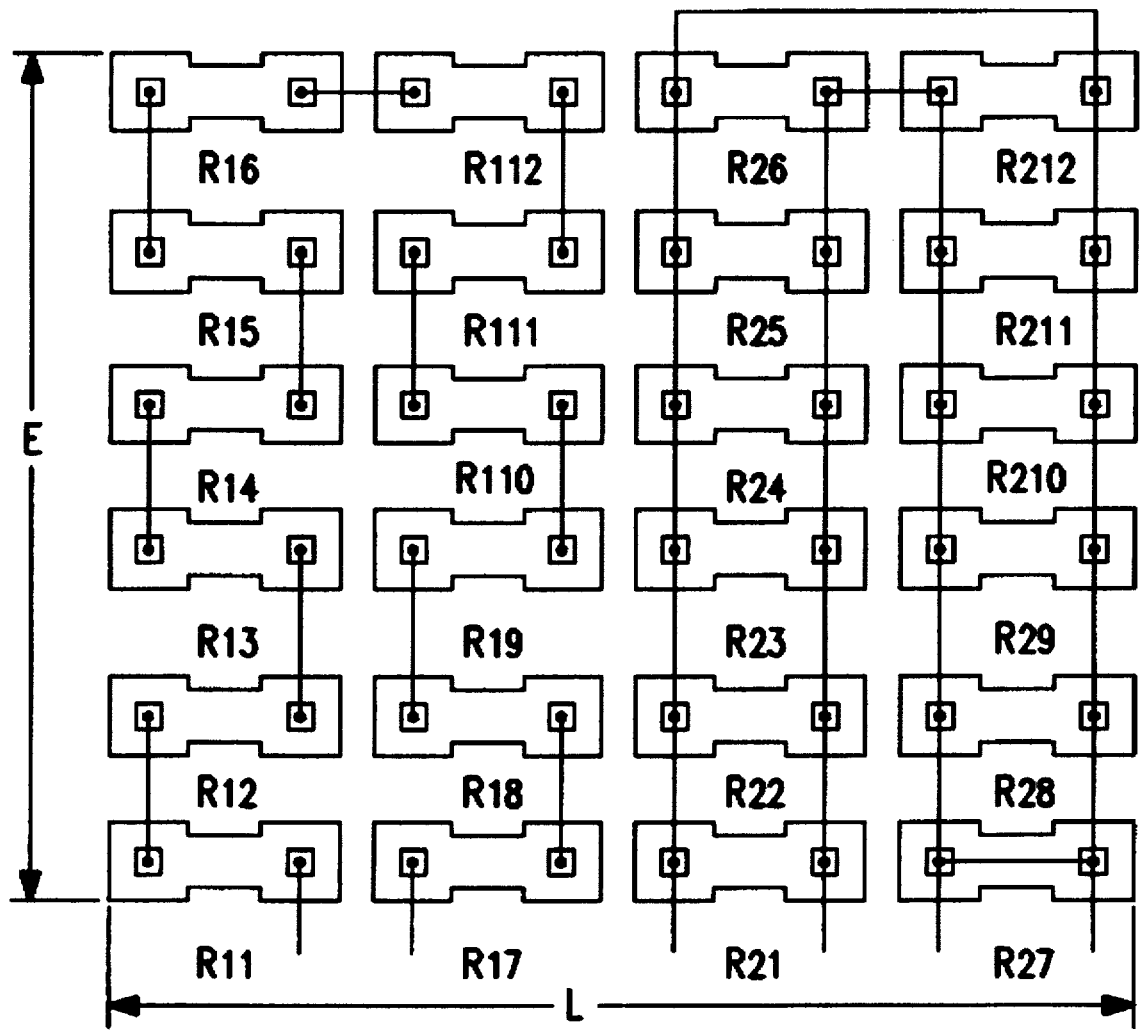
FIG. 15 is a diagram showing a layout of still another conventional DA converter.

Referring to FIGS. 14A and 14B, the resistor element disposed in the neighborhood of the digital circuit 101, e.g., R00 is coupled electrically to the digital circuit 101 through the substrate resistor R00 and the diffusion layer capacitance C00. The resistor element disposed in the position most distant from the digital circuit 101 is coupled electrically to the digital circuit 101 through the substrate resistance r00+r12 and the diffusion layer capacitance C12. The resistor element R12 disposed on the end terminal of the diagonal line from the resistor element R00 corresponds to the resistor element R12, for example.

As is apparent from the layout shown in FIG. 1, the substrate resistor r12 indicates a substrate resistor between the resistance elements R00 and R12, and its resistor value is given by the formula (2). Specifically, the resistor value of the substrate resistor r12 is given by a square root of the sum of the value obtained by squaring the sum r01+r02+r03 of the substrate resistors between the resistor elements in the series circuit and the value obtained by squaring the sum of the substrate resistors between the resistor elements R00, R07, R08, and R15. The series circuit is composed of the resistor elements R00 to R03 shown in FIG. 1.

$$r_{12} = \sqrt{(r_{01} + r_{02} + r_{03})^2 + \left(\sum_{n=0}^{15} R_n\right)^2} \quad (2)$$

In the first embodiment of the present invention, since the distances between the resistor elements are very small, the substrate resistor r11 has a minute value. After all, the following formula (3) is satisfied.

$$r00 \equiv r00 + r12 \quad (3)$$

Therefore, the resistor element disposed in the neighborhood of the digital circuit and one disposed at the position most distant from the digital circuit are coupled electrically to the digital circuit through the substance resistors having approximately the same resistivity. For this reason, approximately the same noise appears on all of the resistor elements R00 to R15 constituting the R string 1. For example, when noise occurs in the positive direction, the error in the input/output characteristic of FIG. 5A, which does not almost depend on the digital input value occurs. Specifically, as shown in the solid line of FIG. 5A, when the output voltage in the neighborhood of the negative reference voltage −Vref shifts toward the positive direction, the output voltage with respect to all digital input value, including the positive reference voltage +Vref, shifts toward the positive direction by approximately the same quantity.

Figure 5B:
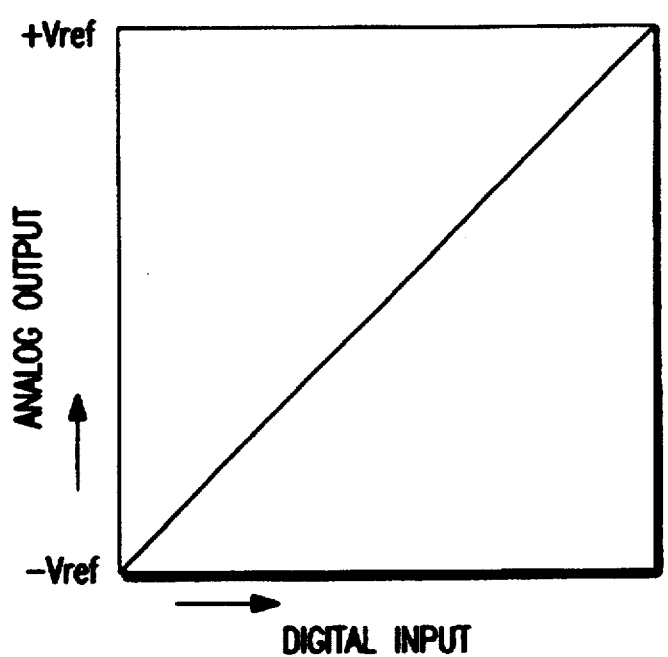

In the input/output characteristic shown by the solid line of FIG. 5A; the straight line error is almost not present so that an analog output, shown by the solid line of FIG. 5B, can be obtained which is close to the ideal value. Therefore, it will be possible to achieve a high precision DA converter.

In the foregoing embodiment, as described before, the coupling resistors of the digital circuit and the resistor elements are expressed as the total sum r01+r02+r03+...+r15 of the resistor elements. According to the first embodiment of the present invention, the substrate resistor r12 is reduced to about ¼ to ⅓ of the conventional DA converter, as shown in the substrate resistor r12 given by the formula (2). In the first embodiment of the present invention, for example, in the case where a 10 bit DA converter is employed, the value of the substrate resistor is reduce to about 1/20 the conventional DA converter. As the precision of the DA converter is higher, the reduction in the coupling resistor between the resistor elements and the digital circuit becomes larger.

Figure 3:
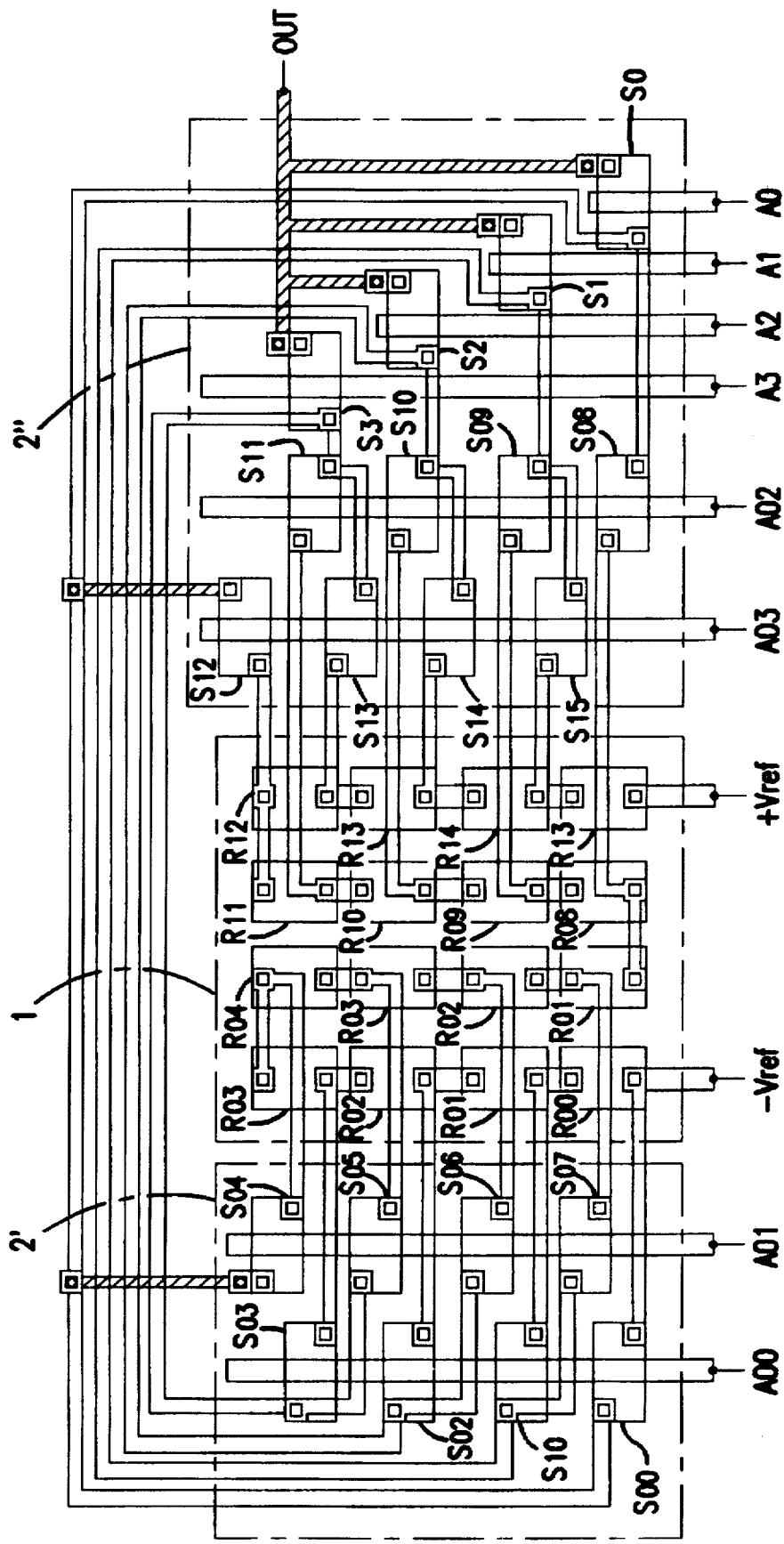
FIG. 3 is a diagram showing a layout of another embodiment of the present invention.

FIG. 3 is a diagram showing a layout of a DA converter of a second embodiment of the present invention.

Referring to FIG. 3, an R string is formed between positive and negative reference voltages +Vref and −Vref. The R string is formed by serpentine-shaped series circuits where resistor elements R00 to R03, R04 to R07, R08 to R11, and R12 to R15 are arranged in alignment.

To selectively output potentials from the connection nodes of the resistor elements R00 to R15, selection circuits 2' and 2" are disposed at both sides of the R string 1. The selection circuit 2' is composed of switching elements S00 to S03, and S04 to S07. The switching elements S00 to S03, and S04 to S07 are N channel MOS transistors, the gates of which are supplied with first selection signals A00 and A01. The selection circuit 2" is composed of switching elements S08 to S11, and S12 to S15, and switching elements S0 to S3. The switching elements S08 to S15 are N channel MOS transistors, the gates of which are supplied with the first signals A02 and A03, and the switching elements S0 to S3 are N channel MOS transistors, the gates of which are supplied with second selection signals A0 to A3.

Figure 4:
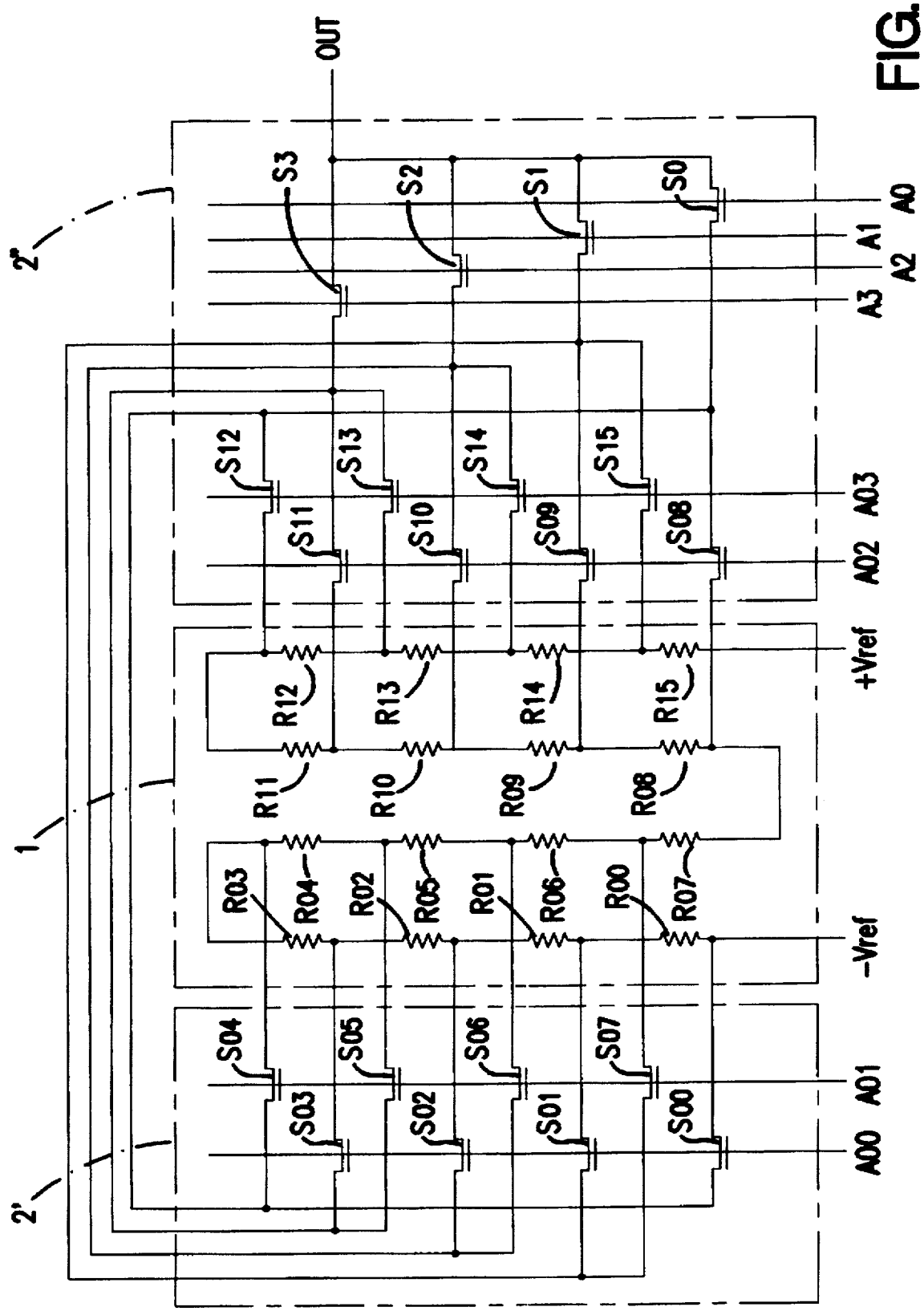
FIG. 4 is a diagram showing an equivalent circuit of another embodiment of the present invention.

The connection nodes of the resistor elements R00 to R15 are connected to corresponding one terminal of the switching elements S00 to S15 by first layer metal wirings. The other terminals of the switching elements S00, S04, S08, and S12, S01, S07, S09, and S15, S02, S06, S10, and S14, S03, S05, S11, and S13 are connected to corresponding one terminals of the switching elements S0 to S3 by either the first layer metal wirings or both of the first layer metal wirings and a second layer metal wirings shown by the oblique lines of FIG. 3. The other terminals of the switching elements S0 to S3 are connected to each other in common by the first and second layer metal so that the output is fetched from the output terminal OUT. An equivalent circuit of the DA converter of the second embodiment of the present invention is shown in FIG. 4.

It should be noted that an operation of the DA converter of the second embodiment is similar to that of the DA converter of the first embodiment and an explanation thereof will be omitted.

In the second embodiment, the selection circuits 2' and 2" are disposed separately along the two lines of the R string confronting one another. Therefore, the metal wirings for connecting the connection nodes of the resistor elements R00 to R15 to one terminals of the switching elements S00 to S15 are also divided into two groups. The number of the metal wirings passing on the resistor elements is reduced so that the R string can be formed with smaller resistor elements. Thus, the occupied area can be reduced and the distances between the resistor elements can be reduced much more, thereby reducing the level difference of the noise occurring in all of the resistor elements still further. The DA converter with higher precision can be constituted.

Figure 6:
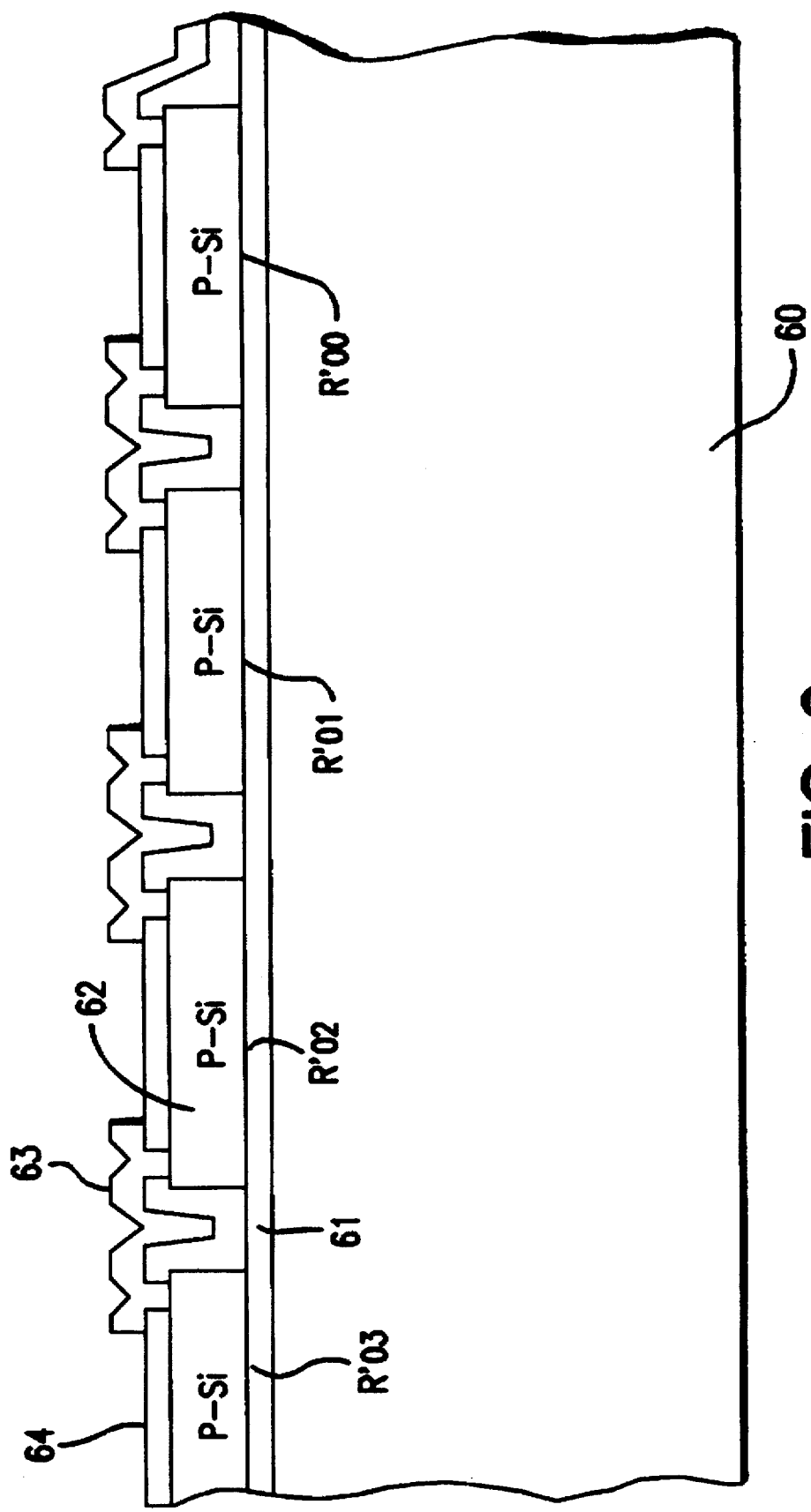
FIG. 6 shows a sectional view of a semiconductor substrate on which resistor element in the present invention, formed of a polysilicon, are formed.
Figure 7:
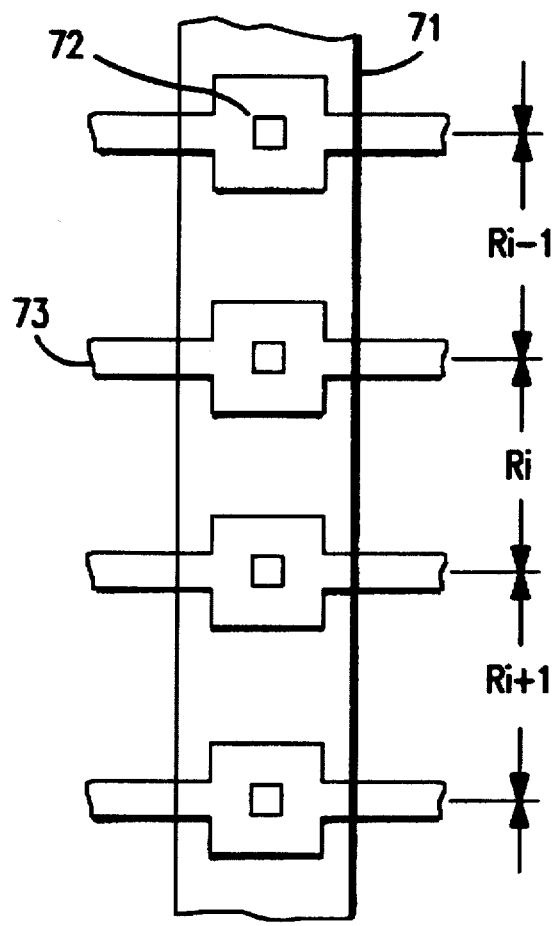
FIG. 7 is a plan view of resistor elements in the present invention formed of belt-shaped resistive body.

In each of the embodiments of the present invention, the N type diffusion layers formed in the neighborhood of the semiconductor substrate serving as the resistor elements are used for explaining the present invention. However, for example, as shown in FIG. 6, when the resistor elements formed of a polysilicon (P-Si) 62 etc. formed on an insulating film 61 on a surface of a semiconductor substrate 60 is employed, it is apparent that similar effects to the above embodiments will be obtained.

In addition, the explanation for the above embodiments was conducted using the R string composed of the resistor elements which constituted by connecting the unit resistors with the metal wirings. The similar effects can be obtained apparently when the R string composed of the resistor elements where taps are formed by the metal wirings 73 through the contact holes 72 on the belt-shaped resistor body 71.

Figure 8:
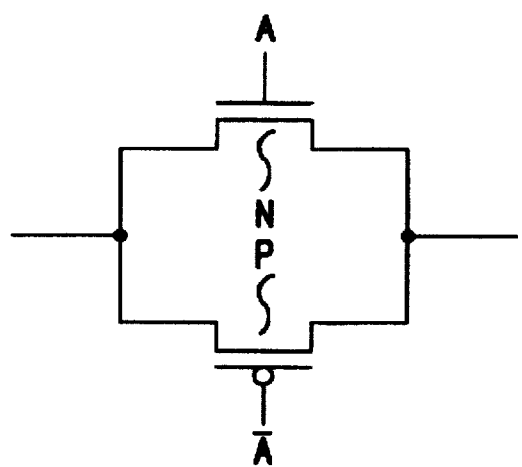
FIG. 8 is a diagram showing another structure of a switching element constituting a selection circuit in the present invention.
Figure 9:
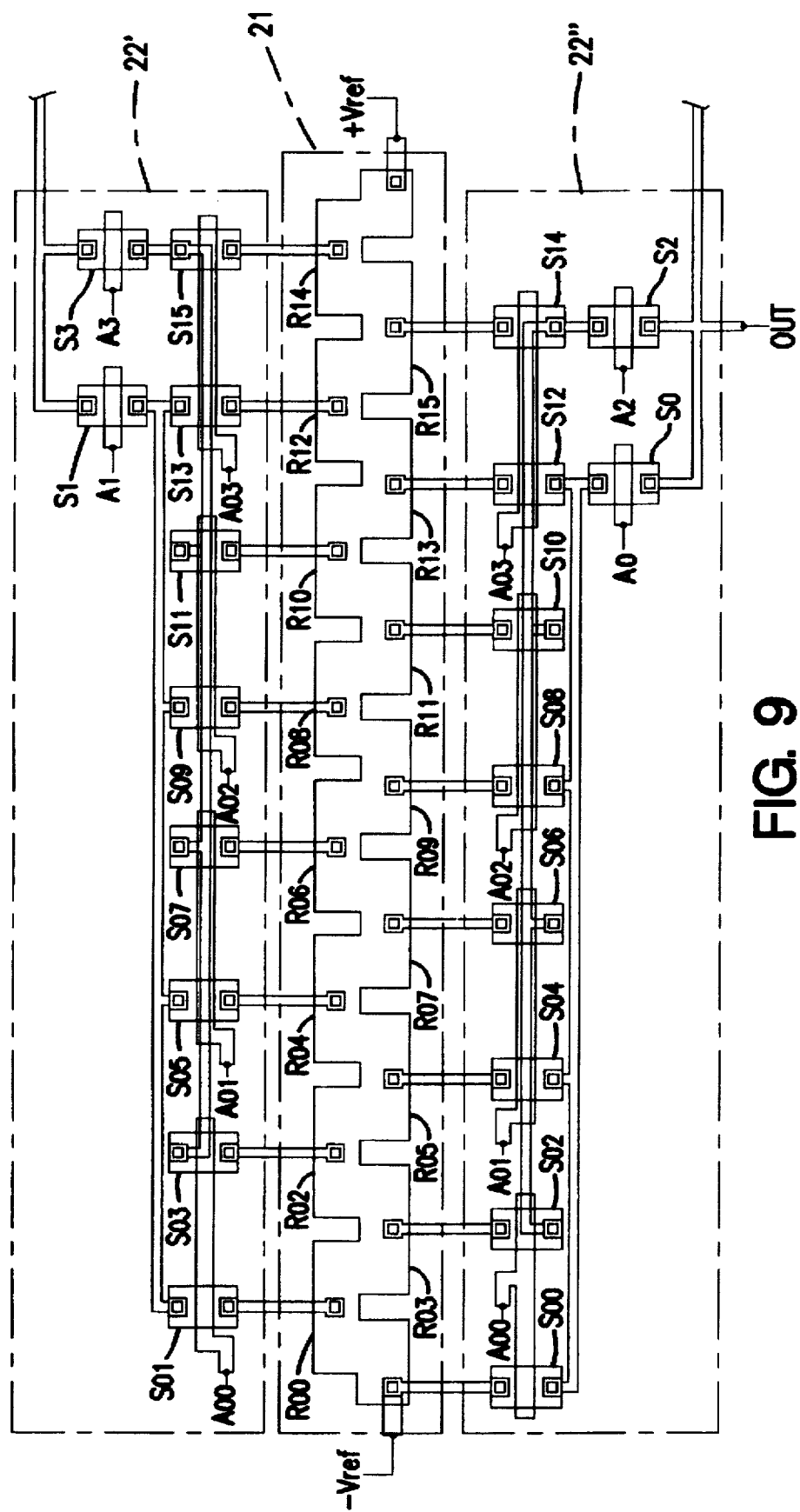
FIG. 9 is a diagram showing a layout of a conventional DA converter.
Figure 10:
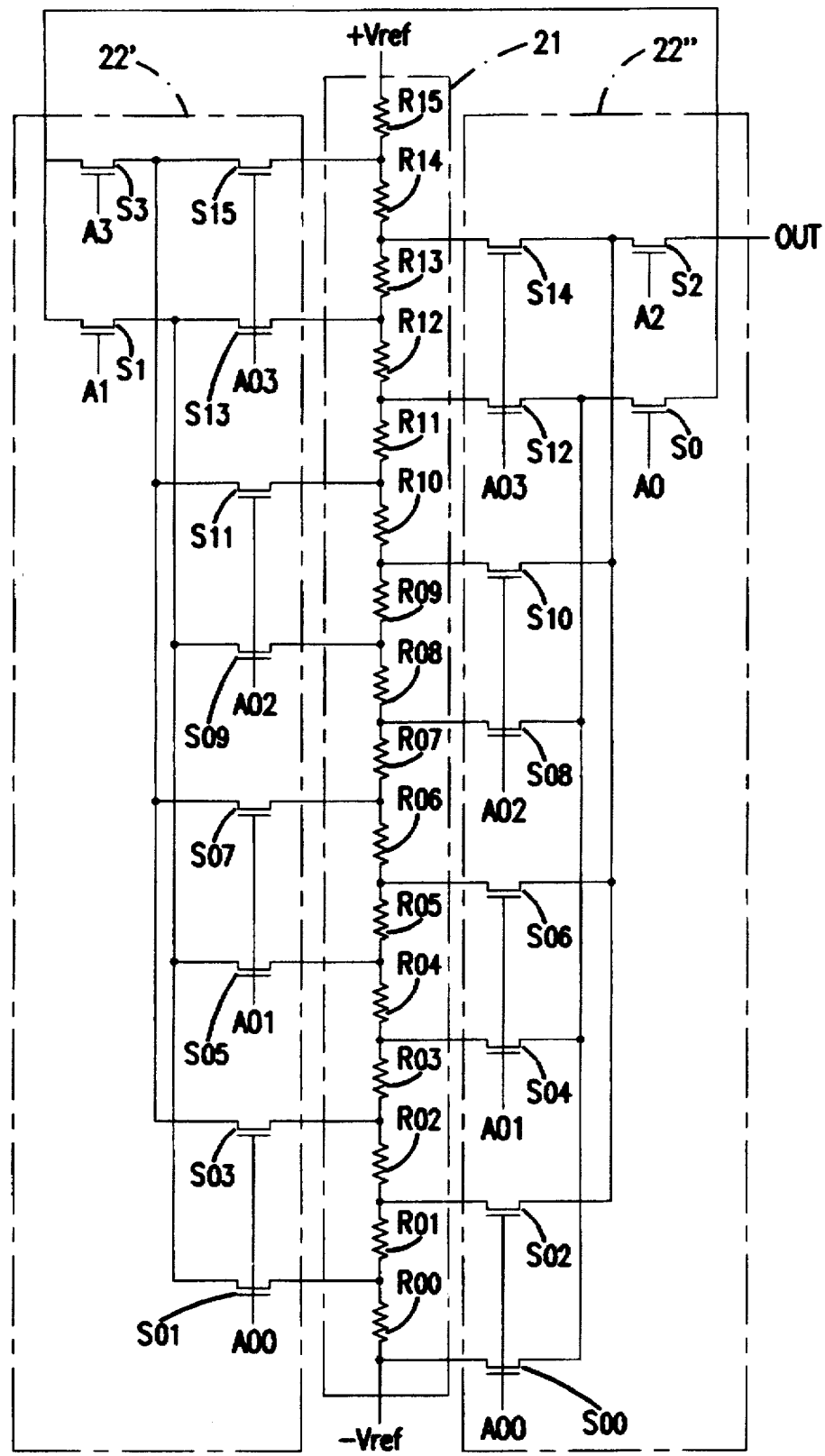
FIG. 10 is a diagram showing an equivalent circuit of the conventional DA converter.
Figure 11:
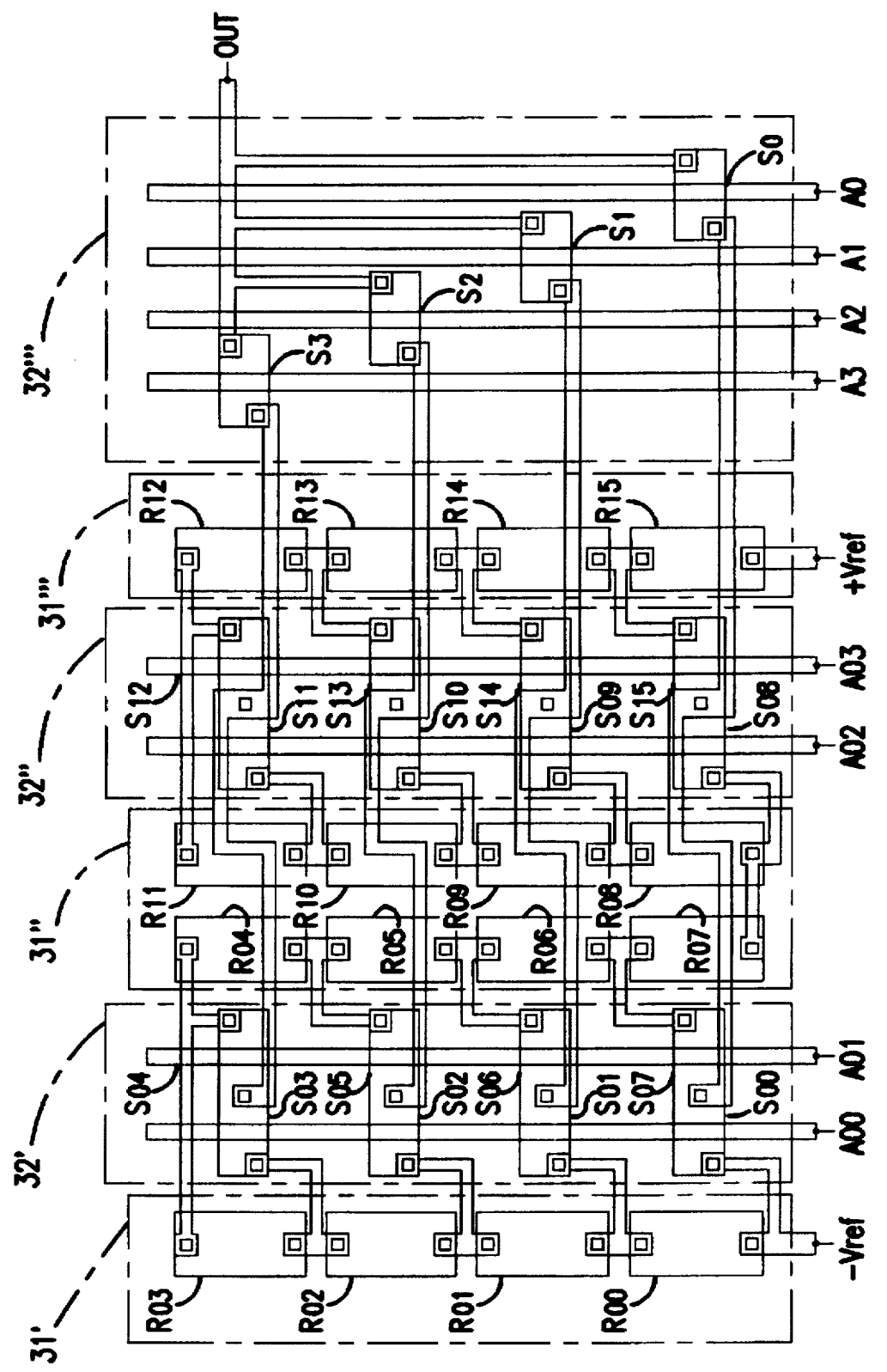
FIG. 11 is a diagram showing a layout of another conventional DA converter.
Figure 12:
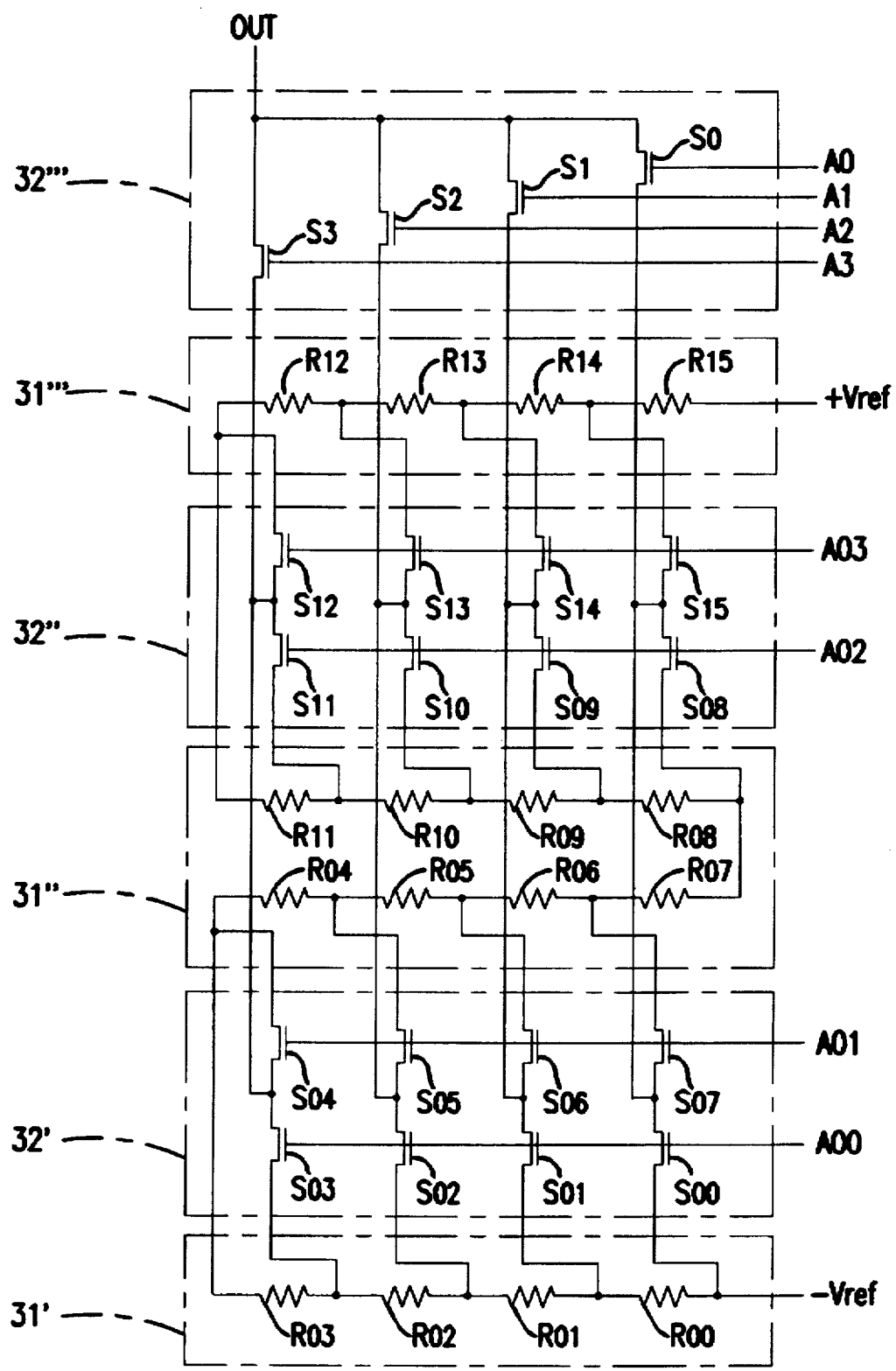
FIG. 12 is a diagram showing a layout of another conventional DA converter.
Figure 13A:
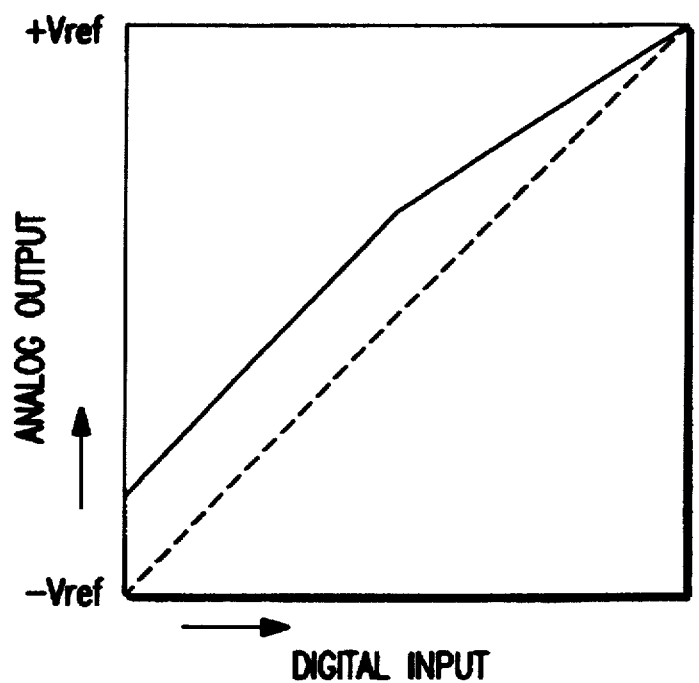
FIGS. 13A and 13B are diagrams showing schematically an input/output characteristic of the conventional DA converter, particularly.
Figure 13B:
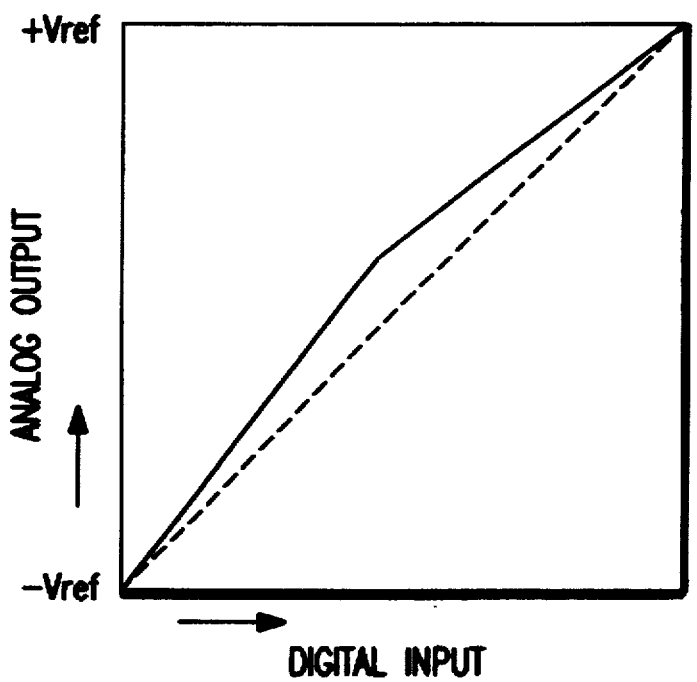

Furthermore, the above embodiments were described using N channel MOS transistors, i.e., MOS field effect transistors, serving as the switching elements of the selection circuits, the gates of which are supplied with the selection signals. As shown in FIG. 8, when switching elements composed of N channel MOS transistors and P channel MOS transistors are used, the gates of which are supplied with selection signals A and inverted signals, respectively, it is apparent that the similar effects will be obtained.

As described above, according to the present invention, the DA converter comprises an R string composed of a plurality of series circuits, each of which meanders to form a serpentine shape, formed of a plurality of resister elements disposed in alignment; and selection circuits disposed in one side of the R string, which are composed of switching elements for selectively outputting potentials from connection nodes of the resistor elements. Thus, a high precision DA converter can be obtained, where the straight line error can be greatly reduced even when noise is applied, the noise-proof property can be greatly enhanced, and operation error will scarcely be produced by offset and gain adjustments.

Moreover, according to present invention, the selection circuits are disposed separately along the two lines of the R string confronting one another. Therefore, the metal wirings for connecting the connection nodes of the resistor elements to one terminals of the switching elements are also divided into two groups. The number of the metal wirings passing on the resistor elements is reduced so that the R string can be formed with smaller resistor elements. Thus, the occupied area can be reduced and the distances between the resistor elements can be reduced much more, thereby reducing the level difference of the noise occurring in all of the resistor elements still further. Thus, a DA converter with a higher precision can be constituted.

It will be understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

I claim:

1. A semiconductor device comprising:

a substrate having a first portion and a second portion, said second portion formed separate from said first portion;

a first string connected between a first terminal supplying a first voltage and a first node, said first string having a plurality of resistors connected between said first terminal and said first node in series and formed in a first direction, and said resistors connected to each other via a plurality of nodes;

a second string connected between a second node and a third node, said second string having a plurality of resistors connected between said second node and said third node in series and formed in said first direction, said resistors connected to each other via a plurality of nodes, and said second string formed in parallel with said first string;

a third string connected between a fourth node and a fifth node, said third string having a plurality of resistors connected between said fourth node and said fifth node in series and formed in said first direction, said resistors connected to each other via a plurality of nodes, and said third string formed in parallel with said first string and said second string;

a fourth string connected between a sixth node and a second terminal supplying a second voltage, said fourth string having a plurality of resistors connected between said sixth node and said second node terminal in series and formed in said first direction, said resistors connected to each other via a plurality of nodes, said fourth string formed in parallel with said first string, said second string and said third string;

first connecting means for connecting said first node to said second node, said third node to said fourth node and said fifth node to said sixth node, respectively, and said strings connected to each other as serpentine; and selective means connected between each of said nodes and an output terminal formed in said second portion for selecting one of said nodes and outputting a voltage of said selected node to said output terminal.

2. The semiconductor device as claimed in claim 1, wherein said first string has a first resistor connected between said first terminal and a seventh node, a second resistor connected between said seventh node and an eighth node, a third resistor connected between said eighth node and a ninth node and a fourth resistor connected between said ninth node and said first node;

said second string has a fifth resistor connected between said second node and a tenth node, a sixth resistor connected between said tenth node and an eleventh node, a seventh resistor connected between said eleventh node and a twelfth node, and a eighth resistor connected between said twelfth node and said third node;

said third string has a ninth resistor connected between said fourth node and a thirteenth node, a tenth resistor connected between said thirteenth node and a fourteenth node, an eleventh resistor connected between said fourteenth node and a fifteenth node, and a twelfth resistor connected between said fifteenth node and said fifth node; and said fourth string has a thirteenth resistor connected between sixth node and sixteenth node, a fourteenth resistor connected between said sixteenth node and a seventeenth node, a fifteenth resistor connected between said seventeenth node and an eighteenth node, and a sixteenth resistor connected between said eighteenth node and said second terminal.

3. The semiconductor device as claimed in claim 2, wherein said selective means includes, a first switching element connected between said seventh node and a first output node, a second switching element connected between said eighth node and a second output node, a third switching element connected between said ninth node and third output node, a fourth switching element connected between said second node and a fourth output node, a fifth switching element connected between said tenth node and said third node, a sixth switching element connected between said eleventh node and said second output node, a seventh switching element connected between said twelfth node and said first output node, an eighth switching element connected between said fourth node and said fourth output node, a ninth switching element connected between said thirteenth node and said first output node, a tenth switching element connected between said fourteenth node and said second output node, an eleventh switching element connected between said fifth node and said third output node, a twelfth switching element connected between said sixth node and said fourth output node, a thirteenth switching element connected between said sixteenth node and said third output node, a fourteenth switching element connected between said seventeenth node and said second output node, a fifteenth switching element connected between said eighteenth node and said first output node, a first output switching element connected between said first output node and said output terminal, a second output switching element connected between said second output node and said output terminal, a third output switching element connected between said third output node and said output terminal, and a fourth output element connected between said fourth output node and said output terminal.

4. The semiconductor device as claims in claim 1; wherein each of said switching elements comprises a transistor.

5. The semiconductor device as claimed in claim 1, wherein each of said resistors comprises a diffused resistor.

6. The semiconductor device as claimed in claim 1, wherein each of said resistors comprises a polysilicon.

7. A semiconductor device comprising:

a substrate having a first portion, a second portion and a third portion, said second portion being formed separate from said first portion and third portion, said third portion being formed separate from said first portion and second portion, and said second portion formed in a first direction from said first portion and said third portion being formed in a second direction differing from said first direction from said first portion;

a first string connected between a first terminal supplying a first voltage and a first node, said first string having a plurality of resistors connected between said first terminal and said first node in series and formed in a first direction, said resistors being connected to each other via a plurality of nodes;

a second string connected between a second node and a third node, said second string having a plurality of resistors connected between said second node and said third node in series and formed in said first direction, said resistors being connected to each other via a plurality of nodes, and said second string being formed in parallel with said first string;

a third string connected between a fourth node and a fifth node, said third string having a plurality of resistors connected between said fourth node and said fifth node in series and formed in said first direction, said resistors being connected to each other via a plurality of nodes, and said third string being formed in parallel with said first string and said second string;

a fourth string connected between a sixth node and a second terminal supplying a second voltage, said fourth string having a plurality of resistors connected between said sixth node and said second node in series and formed in said first direction, said resistors being connected to each other via a plurality of nodes, said fourth string being formed in parallel with said first string, said second string and said third string;

first connecting means for connecting said first node to said second node, said third node to said fourth node and said fifth node to said sixth node, respectively, said strings being connected to each other as serpentine;

first selective means connected between each of said nodes of said first and second strings and an output terminal formed in said second portion; and second selective means connected between each of said nodes of said third and fourth strings and an output terminal formed in said third portion.

8. The semiconductor device as claimed in claim 7, wherein said first string has a first resistor connected between said first terminal and a seventh node, a second resistor connected between said seventh node and an eighth node, a third resistor connected between said eighth node and a ninth node and a fourth resistor connected between said ninth node and said first node;

said second string has a fifth resistor connected between said second node and a tenth node, a sixth resistor connected between said tenth node and an eleventh node, a seventh resistor connected between said eleventh node and a twelfth node, and a eighth resistor connected between said twelfth node and said third node;

said third string has a ninth resistor connected between said fourth node and a thirteenth node, a tenth resistor connected between said thirteenth node and a fourteenth node, an eleventh resistor connected between said fourteenth node and a fifteenth node, and a twelfth resistor connected between said fifteenth node and said fifth node; and said fourth string has a thirteenth resistor connected between sixth node and sixteenth node, a fourteenth resistor connected between said sixteenth node and a seventeenth node, a fifteenth resistor connected between said seventeenth node and an eighteenth node, and a sixteenth resistor connected between said eighteenth node and said second terminal.

9. The semiconductor device as claimed in claim 8, wherein said selective means includes, a first switching element connected between said seventh node and a first output node, a second switching element connected between said eighth node and a second output node, a third switching element connected between said ninth node and third output node, a fourth switching element connected between said second node and a fourth output node, a fifth switching element connected between said tenth node and said third node, a sixth switching element connected between said eleventh node and said second output node, a seventh switching element connected between said twelfth node and said first output node, an eighth switching element connected between said fourth node and said fourth output node, a ninth switching element connected between said thirteenth node and said first output node, a tenth switching element connected between said fourteenth node and said second output node, an eleventh switching element connected between said fifth node and said third output node, a twelfth switching element connected between said sixth node and said fourth output node, a thirteenth switching element connected between said sixteenth node and said third output node, a fourteenth switching element connected between said seventeenth node and said second output node, a fifteenth switching element connected between said eighteenth node and said first output node, a first output switching element connected between said first output node and said output terminal, a second output switching element connected between said second output node and said output terminal, a third output switching element connected between said third output node and said output terminal, and a fourth output element connected between said fourth output node and said output terminal;

said first, second, third, fourth, fifth, sixth, seventh switching elements being formed in said second portion, and said eighth, ninth, tenth, eleventh, twelfth, thirteenth, fourteenth, fifteenth switching elements being formed in said third portion.

10. The semiconductor device as claims in claim 9, wherein each of said switching elements comprises a transistor.

11. The semiconductor device as claimed in claim 7, wherein each of said resistors comprises a diffused resistor.

12. The semiconductor device as claimed in claim 7, wherein each of said resistors comprises polysilicon.

* * * * *